(12) United States Patent
Gerald, II et al.

(10) Patent No.: US 6,788,064 B2
(45) Date of Patent: Sep. 7, 2004

(54) PASSIVELY SHIMMED PRINCIPAL DETECTOR ELEMENTS FOR TOROID CAVITY DETECTOR NMR PROBES

(75) Inventors: Rex E. Gerald, II, Brookfield, IL (US); Jerome W. Rathke, Homer Glen, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 10/386,847

(22) Filed: Mar. 12, 2003

(65) Prior Publication Data

US 2003/0173967 A1 Sep. 18, 2003

Related U.S. Application Data

(60) Provisional application No. 60/363,447, filed on Mar. 12, 2002.

(51) Int. Cl.[7] .................................................. G01V 3/00
(52) U.S. Cl. ....................................... 324/322; 324/318
(58) Field of Search ............................... 324/300–322; 600/410–435, 473

(56) References Cited

U.S. PATENT DOCUMENTS

| 5,574,370 | A | | 11/1996 | Woelk et al. ................. 324/320 |
|---|---|---|---|---|
| 6,046,592 | A | | 4/2000 | Rathke et al. ................. 324/321 |
| 6,191,583 | B1 | | 2/2001 | Gerald, II et al. ............. 324/318 |
| 6,463,317 | B1 | * | 10/2002 | Kucharczyk et al. ......... 600/411 |
| 6,469,507 | B1 | | 10/2002 | Gerald, II et al. ............. 324/318 |
| 6,567,690 | B2 | * | 5/2003 | Giller et al. .................. 600/473 |
| 2003/0164703 | A1 | * | 9/2003 | Ferris et al. .................. 324/318 |
| 2003/0173967 | A1 | * | 9/2003 | Gerald, II et al. ............. 324/322 |

* cited by examiner

*Primary Examiner*—Diego Gutierrez
*Assistant Examiner*—Tiffany A. Fetzner
(74) *Attorney, Agent, or Firm*—Emrich and Dithmar, LLC.

(57) ABSTRACT

A novel NMR principal detector element of the present invention comprises a NMR-active inductor in a radio frequency (RF) resonance circuit, and mitigates the distortions in a static magnetic field caused by the introduction of a toroid cavity NMR detector. The RF resonance circuit includes a novel principal detector element, capacitor elements, and a sample chamber (the cavity). The novel principal detector element defines the NMR active portion of the inductance of the electronic resonance circuit. In one embodiment of the invention, the novel principal detector element includes two hemispheres connected by a central rod. The central rod can be of any length and diameter, and the hemispheres can be of any diameter. A typical embodiment of the invention would include a rod that is 2 cm long having a diameter of 1 mm, and hemispheres having a diameter of 5 mm.

20 Claims, 1 Drawing Sheet

PASSIVELY SHIMMED PRINCIPAL DETECTOR ELEMENTS FOR TOROID CAVITY DETECTOR NMR PROBES

RELATED APPLICATION

This application claims the benefit of the filing date of U.S. Provisional Application No. 60/363,447 filed on Mar. 12, 2002 now abandoned.

CONTRACTUAL ORIGIN OF THE INVENTION

The United States Government has rights in this invention pursuant to Contract No. W-31-109-ENG-38 between the United States Government and Argonne National Laboratory.

FIELD OF THE INVENTION

The present invention relates to novel NMR principal detector elements that improve the resolution and line shape of NMR spectra obtained using toroid cavity detector NMR probes.

DESCRIPTION OF THE RELATED ART

It is critical to improve the magnetic field homogeneity in toroid cavity detector NMR probes in order to make them widely accepted and used in the analytical and biochemistry communities. We have invented a passively shimmed principal detector element for toroid cavity probes for the purpose of improving the magnetic field homogeneity in the volume of space occupied by the sample.

The development of high-field Toroid Cavity Detectors (TCDs) for nuclear magnetic resonance (NMR) analyses of mass-limited biological samples is currently motivated by the promise of a substantial increase in sensitivity. However, the inhomogeneity of the external magnetic field ($B_0$) over the sample volume in a TCD is a problem that results in reduced sensitivity. The purpose of the present invention is to improve $B_0$ homogeneity in TCD NMR probes by introducing novel geometrical modifications to the principal detector element (central conductor).

The geometrical interface between two materials with dissimilar volume magnetic susceptibilities is known to cause magnetic field distortions in the NMR-active space. In TCDs the magnetic field distortion problem is due to the exterior and interior interfaces of the cylindrical cavity. The exterior air-copper interface at the top and bottom of the cavity causes distortions in the magnetic field that can be eliminated by elongating the cavity. The interior copper-sample interface at the top and bottom of the cavity also causes distortions in the magnetic field in the sample volume, but elongating the cavity cannot eliminate these distortions. We have invented passively shimmed principal detector elements that reduce magnetic field distortions caused by the interior interfaces at the top and bottom of the cavity. Passive shimming takes advantage of materials with different volume susceptibilities and geometrical forms to homogenize the magnetic field in a prescribed volume. The more commonly used approach to homogenize magnetic fields is the active shimming method. Active shimming requires energized magnet coils that generate correction fields. The magnet coils that are included in commercial NMR instruments were designed to homogenize the sample volume in commercial (Helmholtz-style) NMR probes, and are not capable of correcting magnetic field distortions caused by TCD probes. Magnet coils specifically designed for TCD probes are not available. Alternatively, a combination of different materials arranged in the cylindrical geometry of the TCD affords a passive approach to eliminating magnetic field distortions. A principal detector element of novel geometric designs contained within a TCD which eliminates distortions in the magnetic field in the sample volume is the subject of the present invention.

Three embodiments of a passively shimmed principal detector element in accordance with the present invention have been disclosed by the inventors and are as follows: (1) a cylindrical spool with surfaces that extend beyond the sample volume that is contained within a larger cylindrical cavity containing the sample, (2) susceptibility matching cylindrical plugs above and below the central conductor, and (3) a cylindrical central conductor with spheroid interfaces at both ends. These three devices use a combination of different materials and geometrical structures with cylindrical symmetry to improve the magnetic field homogeneity in TCD probes. We expect that a combination of active and passive shimming devices will be required to make the magnetic field homogeneity performance of TCD probes competitive with commercial NMR probes.

Nuclear magnetic resonance (NMR) analysis is a powerful method by which to determine chemical structures and to examine reaction dynamics in a diversity of chemical and biochemical systems. In particular, NMR analyses of chemical and biochemical systems using toroid cavity NMR detector probes afford the possibility of detecting very small sample quantities not normally analyzable with conventional NMR detector probes that are commercially available.

For example, U.S. Pat. No. 5,574,370, issued Nov. 12, 1996 to Woelk et al., discloses a toroid cavity detector (TCD) system for determining the spectral properties and spatial distance from a fixed axis for a sample using Nuclear Magnetic Resonance. The detection system consists of a toroid cavity with a central conductor oriented along the main axis of the toroidal cylinder and oriented parallel to a static uniform magnetic field, $B_0$. A radio frequency (RF) signal is applied to the central conductor to produce a concentric magnetic field $B_1$ perpendicular to the central axis of the toroid and whose field strength varies as the inverse of the radial position in the toroid. (The position of the center axis of the toroid cavity is the location of the zero position for the radial dimension and axis.) The toroid cavity detection system can be used to encapsulate a sample, or the detection system can be perforated to allow a sample to flow into the detection device or to place the samples in specified sample tubes. Flexible capillary tubing can also be wound about the central conductor and used to transfer and contain a sample or a series of samples. The central conductor can also be coated to determine the spectral property of the coating and the coating thickness. The sample is then subjected to the respective magnetic fields and the responses measured to determine the desired properties.

U.S. Pat. No. 6,046,592, issued Apr. 4, 2000 to Rathke et al., discloses a near-electrode imager for employing nuclear magnetic resonance imaging to provide in situ measurements of electrochemical properties of a sample as a function of distance from a working electrode, also know as the central conductor. The near-electrode imager uses the radio frequency field gradient within a cylindrical toroid cavity resonator to provide high-resolution nuclear magnetic resonance spectral information on electrolyte materials, electrode-electrolyte interphases, and electrode coating materials.

U.S. Pat. No. 6,191,583, issued Feb. 20, 2001 to Gerald II et al., discloses a toroid cavity detector that includes an outer cylindrical housing through which extends a wire along the central axis of the cylindrical housing from a closed bottom portion to the closed top end of the cylindrical housing. In order to analyze a sample placed in the housing, the housing is placed in an externally applied static main homogeneous magnetic field ($B_0$). An RF current pulse is supplied through the wire such that an alternately energized and de-energized magnetic field ($B_1$) is produced in the toroid cavity. The $B_1$ field is oriented perpendicular to the $B_0$ field. Following the RF current pulse, the response of the sample to the applied $B_0$ field is detected and analyzed. In order to minimize the detrimental effect of probe ringing, the cylindrically shaped housing is elongated sufficiently in length so that the top and bottom portions are located in weaker, fringe areas of the static main magnetic $B_0$ field. In addition, a material that tends to lessen the effect of probe ringing is positioned along the top and bottom ends of the toroid cavity. In another embodiment, a plug is positioned adjacent the inside of the top and bottom ends of the toroid cavity so that the sample contained in the toroid cavity is maintained in the strongest and most homogeneous region of the static magnetic $B_0$ field.

U.S. Pat. No. 6,469,507, issued Oct. 22, 2002 to Gerald II et al., discloses imaging apparatus that is used in a toroid cavity detector for nuclear magnetic resonance (NMR) analysis to hold samples relative to a principal detector element which is a flat metal conductor, the plane of which is parallel to the longitudinal axis of the toroid cavity. A sample is held adjacent to or in contact with the principal detector element so that the sample can be subjected to NMR analysis when a static main homogeneous magnetic field ($B_0$) produced by a NMR magnetic device is applied to the toroid cavity and an RF excitation signal pulse is supplied to the principal detector element so that an alternately energized and de-energized magnetic field ($B_1$) is produced in the sample and throughout the toroid cavity. The sample may be components of a coin cell battery which are mounted within the toroid cavity relative to the principal detector element by a non-conductive coin cell battery imager or a press assembly so that the components are hermetically sealed together and so that a direct current potential can be applied to the components. Alternately, a sample is positioned within an O-ring maintained relative to the principal detector element by a pair of glass plates that are disposed on opposite sides of the principal detector element and are compressed towards each other so that NMR analysis can be used when light is transmitted through the sample or to analyze a sample separated from the principal detector element by semi-permeable membranes.

The subject matter of each of the aforementioned U.S. Pat. Nos. 5,574,370; 6,046,592; 6,191,583; and 6,469,507 is incorporated herein by reference.

A principal object of the present invention is to provide a novel principal NMR detector element that allows recording of undistorted NMR spectra using a toroid cavity NMR detector probe.

SUMMARY OF THE INVENTION

In brief, the novel principal NMR detector element of the present invention comprises the NMR-active inductance of a radio frequency (RF) resonance circuit. The RF resonance circuit includes a principal detector element, capacitor elements, and a cavity sample chamber. The principal detector element forms an inductor in the RF resonance circuit.

In one embodiment of the invention, the principal NMR detector element is comprised of two metallic hemispheres connected together by a metallic central rod to form the general shape of a dumbbell. Attaching each hemisphere to an opposed end of the rod and connecting this combination to an RF circuit allows the combination to function as the inductor of the NMR RF circuit.

More specifically, a cylindrical tube is fitted and extended over both hemispheres to form a gas-tight volume (the sample volume) bounded by the flat bottoms of the hemispheres and the outer surface of the rod. The sample fully or partially fills the sample volume. The geometry and material of the hemispheres are chosen and designed according to the arrangement of the fluid or fluids disposed within the sample volume so that a uniform static magnetic field fills the sample volume when the fluid(s) are surrounding the principal detector element.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENTS

Figure 1:
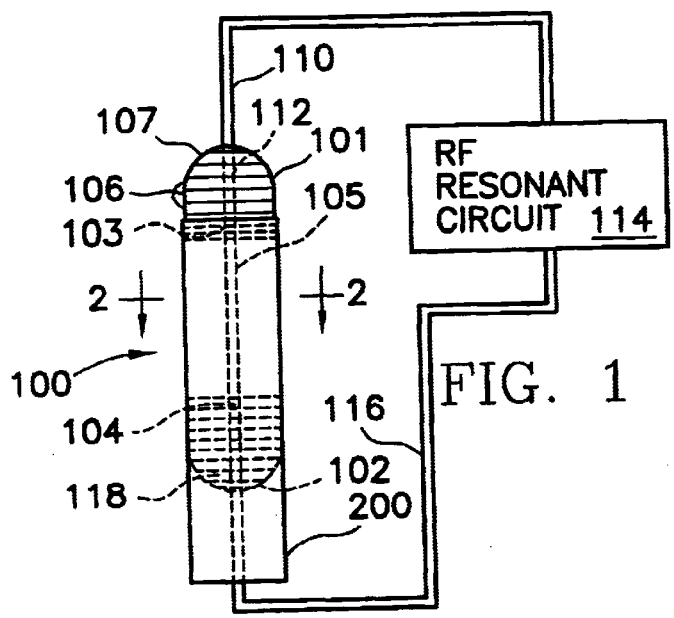
FIG. 1 is a side elevation view shown partially in phantom of a NMR principal detector element in accordance with the principles of the present invention.
Figure 2:
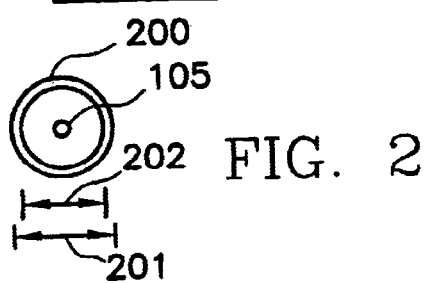
FIG. 2 is a transverse sectional view of the NMR principal detector element shown in FIG. 1 taken along site line 2-2 therein.

With reference now to the drawings, a novel NMR principal detector element 100 in accordance with the present invention which takes advantage of various geometrical shapes and materials to reduce or eliminate distortions in a static magnetic field caused by the presence of materials used to contain the sample is shown in FIG. 1. NMR principal detector element 100 advantageously is used to record NMR spectra that exhibit minimal distortions to a theoretical resonance line shape. The NMR principal detector element 100 is fabricated from one piece of material or from several pieces of material and assembled as shown in FIG. 1. FIG. 1 is a side elevation view shown partially in phantom of the inventive NMR principal detector element 100. A transverse sectional view of the NMR principal detector element 100 shown in FIG. 1 taken along site line 2-2 therein is shown in FIG. 2.

In accordance with features of the invention, NMR principal detector element 100 makes possible NMR spectroscopy investigations of gases, fluids, liquids, semisolids, and solids. NMR data derived from NMR principal detector element 100 is unique in that it is characterized by greater sensitivity than conventional commercially available detectors. The level of detail of the composition of the sample is also greater because the sensitivity obtainable from NMR principal detector element 100 is greater than that available from existing devices.

Enhanced signal sensitivity for samples that are in direct contact with the NMR principal detector element 100 has been observed. The inventive NMR principal detector element 100 includes a central rod 105 disposed on the longitudinal axis of the detector and first and second hemispheres 101 and 102 disposed on opposed ends of the central rod. The central rod 105, lower portion of the first hemisphere 101, and the second hemisphere 102 are shown in dotted line form. The sensitivity from NMR principal detector element 100 is radially distributed with the most sensitive region immediately adjacent to the surface of the detector's central rod 105. An electrical conductor 110 is inserted in a threaded aperture 112 in an upper portion of the first hemisphere 101 and an electric conductor 116 is inserted in a threaded aperture 118 in a lower portion of the second hemisphere 102 for electrically coupling the NMR principal detector element 100 to an RF resonant circuit 114.

The first and second hemispheres 101, 102 of the NMR principal detector element 100 can each be fabricated from a single piece of material, or may be in the form of plural generally flat disks 106 arranged in a stacked manner. The first and second hemispheres 101 and 102 are respectively provided with threaded apertures 103 and 104 to threadably engage opposed ends of the central rod 105 for providing an RF current path. The disks can be made of metallic or non-metallic materials and may possess electrical conductivity properties for the purpose of conducting RF currents. In one embodiment, the disks are of uniform composition and are fabricated from metallic substances. In another embodiment, the disks are fabricated from non-metals or substances with poor electrical conductivity and are coated on their outer edge periphery with a good electrical conductor 107. The coating can be of any thickness, but a preferred thickness is that of the RF skin depth for the conductive material and RF frequency for which the NMR principal detector element 100 is designed. The flat disks 106 can have virtually any shape, preferably are circular. The central rod 105 can have any shape, but a preferable shape is cylindrical. The central rod 105 can be made of metallic or non-metallic materials and may possess electrical conductivity properties for the purpose of conducting RF currents. In one embodiment, the central rod 105 is a solid metallic material. In another embodiment, the central rod 105 is fabricated from a non-conductive material and is coated on its exterior surface with a good electrical conductor. The coating can be of any thickness, but a preferred thickness is that of the RF skin depth for the conductive material and RF frequency for which the NMR principal detector element 100 is designed. The central rod 105 and the hemispheres 101 and 102 can also be fabricated from one piece of material. In one embodiment of NMR principal detector element 100, the central rod 105 and the hemispheres 101 and 102 are fabricated from one piece of copper, silver, gold, or other metal. In another embodiment of NMR principal detector element 100, the central rod 105 is fabricated from one piece of copper, silver, gold, or other metal and is provided with threaded apertures at both opposed ends, and threadably positioned in respective apertures that extend into the hemispheres 101 and 102.

Sample analyses by nuclear magnetic resonance spectroscopy and imaging is one of the most powerful approaches available for the determination of chemical structures and molecular dynamics in a diversity of chemical and physical systems. The NMR principal detector element 100 for acquiring undistorted NMR spectra of the present invention is a new and useful analytical device for non-invasive spectroscopic and imaging investigations of the molecular architecture and dynamics of gas, fluid, liquid, semisolid, and solid materials.

As also shown in FIG. 1, NMR principal detector element 100 further includes a tube or sleeve structure, or containment vessel, 200 is for holding the sample to be analyzed in a compartment defined by the tube, the bases of the first and second hemispheres 101 and 102, and the outer surface of central rod 105. In one embodiment, tube 200 is in the form of a Teflon® sleeve with an outer diameter 201 of 0.5936" and an inner diameter 202 of 0.3936" as shown in the sectional view of FIG. 2. The sleeve's inner diameter 202 closely matches the diameter of the first and second hemispheres 101 and 102 so that a gas-tight fit is formed when sleeve 200 is positioned over the NMR principal detector element 100.

Sleeve 200 is comprised of conductive or non-conductive material. A sleeve 200 made of conductive materials is generally insulated in some manner so that the sleeve does not provide an electrical pathway between the first hemisphere 101 and the second hemisphere 102. In some cases, such a pathway may exist provided that sleeve 200 is designed so that the conduction of RF currents by the sleeve does not render the NMR principal detector element 100 inoperative.

The tube or sleeve designated 200 can be fabricated of multiple adjoining tubes of different materials. The tube or sleeve designated 200 can be fabricated of multiple concentric tubes of different materials. The tube or sleeve designated 200 can be fabricated of a combination of multiple concentric tubes and multiple adjoining tubes of different materials.

The NMR principal detector element 100 can be formed by a selected one of various metals, alloys, and pure or doped semimetals. The principal detector element inductor 100 can be formed, for example, of gold, silver, gallium, platinum, and palladium.

The tube or sleeve 200 can be formed by a selected one of various metals, alloys, and pure or doped semimetals. The tube or sleeve 200 can be formed, for example, of Teflon®, Ultem®, polymers, plastics, composites, ceramics, metals, gold, silver, gallium, platinum, and palladium.

Figure 3:
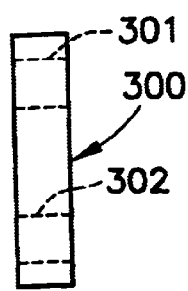
FIGS. 3 and 4 are side elevation views of two embodiments of a cylindrical tube for use in the NMR principal detector element of the present invention.
Figure 4:
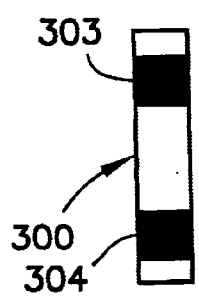

FIGS. 3 and 4 show an additional embodiment of the tube which could be used in the NMR principal detector element of the present invention. In the embodiment shown as FIG. 3, tube 300 is comprised of Teflon® and is 2.25" in length and has two concentric sleeves 301 and 302 (shown in dotted line form) positioned in the interior of the tube. The outside of the tube 300 is shown in FIG. 4 and includes two concentric and movable outer sleeves 303 and 304 positioned at the exterior of the tube. Concentric sleeves 301 and 303 form a first capacitor, with variable capacitance according to the mutual overlap of both sleeves. Concentric sleeve 301 makes RF electrical contact with the NMR principal detector element. Concentric sleeves 302 and 304 form a second capacitor, with variable capacitance according to the mutual overlap of both sleeves. Concentric sleeve 302 makes RF electrical contact with the NMR principal detector element. These capacitors provide the required coupling between the NMR principal detector element and an external RF circuit (not shown) that is required to affect NMR analyses on samples. Electrical connections can be made between sleeves 301 and 302 and/or between sleeves 303 and 304 for the purpose of adjusting the resonance frequency of the NMR principal detector element.

Figure 5:
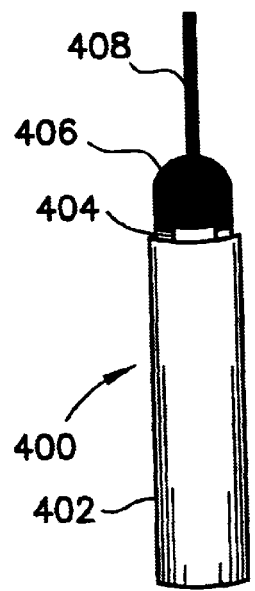
FIG. 5 is a side elevation view of a NMR principal detector element in accordance with the present invention containing a sample of liquid water wherein the detector element's outer tube and the surface tension of the water act to contain the water sample.

FIG. 5 is a side elevation view of a NMR principal detector element 400 in accordance with the present invention which includes cylindrical tube 402. The NMR principal detector element 400 further includes a rod (not shown) and a pair of hemispheres (where only one hemisphere is shown as element 406 in the figure). An electrical conductor 408 is coupled to the hemisphere 406. A sample of liquid water 404 is disposed substantially within the NMR principal detector element 400 and is disposed about its rod which is not shown for simplicity. The tube 402 and the surface tension of the water act to contain the water sample 404. In the embodiment shown, the tube 402 does not completely contain the water sample 404. This embodiment is useful for NMR investigations of the molecular structure and dynamics of water responsible for the surface tension at a water-air interface. In the preferred embodiment the tube 402 completely contains the sample and may extend beyond the total longitudinal length dimension of the NMR principal detector element 400.

While the present invention has been described with reference to the details of the embodiments of the invention shown in the drawing, these details are not intended to limit the scope of the invention as claimed in the appended claims.

What is claimed is:

1. A passively shimmed, toroidal cavity NMR principal detector element comprising:
    an electrically conductive rod having first and second opposed ends;
    first and second electrically conductive hemispherical structures each having a respective flat end portion attached to the first and second opposed ends of said rod, respectively;
    first and second electrical conductors respectively attached to rounded portions of said first and second hemispherical structures; and
    a cylindrical sleeve disposed around and contacting said first and second hemispherical structures forming an enclosed toroidal volume between the flat end portions of the hemispherical structures and an outer surface of the rod, and extending beyond both hemispherical structures by a dimension approximately equal to a diameter of the hemispherical structures or a length of the rod.

2. A NMR principal detector element as recited in claim 1 wherein said rod and hemispherical structures are comprised of a solid metallic conductor.

3. A NMR principal detector element as recited in claim 1 wherein said rod and hemispherical structures are comprised of a hollow metallic conductor.

4. A NMR principal detector element as recited in claim 1 wherein said rod and hemispherical structures are comprised of a hollow metallic conductor that is filled with a material of a selected magnetic susceptibility.

5. A NMR principal detector element as recited in claim 1 wherein said rod and hemispherical structures are comprised of a hollow metallic conductor filled with a mixture of materials of selected magnetic susceptibilities.

6. A NMR principal detector element as recited in claim 1 wherein at least one of said hemispherical structures is comprised of concentric stacked disks of materials of selected magnetic susceptibilities.

7. A NMR principal detector element as recited in claim 1 wherein at least one of said hemispherical structures is comprised of an assembly of concentric stacked disks of materials of selected magnetic susceptibilities and electrical conductivities.

8. A NMR principal detector element as recited in claim 1 wherein at least one of said hemispherical structures is comprised of an assembly of solid hemispheres made of materials of selected magnetic susceptibilities and electrical conductivities.

9. A NMR principal detector element as recited in claim 1 wherein at least one of said hemispherical structures is comprised of a single solid body of selected magnetic susceptibilities and electrical conductivities and includes a concentric aperture for receiving an end of said rod.

10. A NMR principal detector element as recited in claim 1 wherein at least one of said hemispherical structures is comprised of concentric stacked washers having selected magnetic susceptibilities and electrical conductivities.

11. A NMR principal detector element as recited in claim 1 wherein said rod and hemispherical structures are hollow.

12. A NMR principal detector element as recited in claim 11 wherein said hollow rod and hemispherical structures are filled with materials of selected magnetic susceptibilities and electrical conductivities.

13. A NMR principal detector element as recited in claim 1 wherein said rod and hemispherical structures are coated or plated with materials of selected magnetic susceptibilities and electrical conductivities.

14. A NMR principal detector element as recited in claim 1 wherein said rod and hemispherical structures have highly polished surfaces.

15. A passively shimmed, toroidal cavity NMR detector which detects NMR spectra of a sample of a gas fluid, liquid, semisolid, solid, or mixtures thereof contained in a sample volume in the shape of a toroid that is bounded by flat ends of first and second hemispherical structures, an exterior surface of a rod, and an interior surface of a containment sleeve.

16. A cylindrical containment sleeve covering a passively shimmed, toroidal cavity NMR detector which contains a sample in a toroidal volume bounded by flat ends of first and second hemispherical structures, an exterior surface of a rod, and an interior surface of said cylindrical containment sleeve.

17. A cylindrical sleeve comprised of a hard and a flexible material covering a passively shimmed, toroidal cavity NMR detector containing a sample in a toroidal volume bounded by flat ends of first and second hemispherical structures, an exterior surface of a rod, and an interior surface of said cylindrical sleeve.

18. A cylindrical sleeve comprised of conductive exterior materials and non conductive and flexible interior materials covering a passively shimmed, toroidal cavity NMR detector containing a sample in a toroidal volume bounded by flat ends of first and second hemispherical structures, an exterior surface of a rod, and an interior surface of said cylindrical sleeve, which provides a conductive surface for RF currents on an exterior surface of said sleeve so as not to make electrical contact with the NMR detector disposed within said cylindrical sleeve.

19. A cylindrical sleeve covering a passively shimmed, toroidal cavity NMR detector comprised of conductive exterior materials forming a conductive path for RF currents, and flexible interior materials containing a sample in a toroidal volume bounded by flat ends of first and second hemispherical structures, an exterior surface of a rod, and an interior surface of said cylindrical sleeve, wherein said cylindrical sleeve provides a conductive surface for the RF currents on an exterior surface of said sleeve so as not to make electrical contact with the NMR detector contained within said sleeve, and further comprising first conductive films on an interior of said cylindrical sleeve in contact with said hemispherical structures, and second conductive films on an exterior of said sleeve, with said first and second conductive films forming a capacitor between the exterior and interior surfaces of said cylindrical sleeve.

20. A cylindrical sleeve having interior and exterior metallic surfaces and covering a passively shimmed, toroidal cavity NMR detector comprised of exterior materials forming a conductive path for RF currents, and flexible interior materials containing a sample in a toroidal volume bounded by flat ends of first and second hemispherical structures, an exterior surface of a rod, and an interior surface of said cylindrical sleeve, wherein said cylindrical sleeve provides a conductive surface for the RF currents on an exterior surface of said sleeve so as not to make electrical contact with the NMR detector disposed within said sleeve, and further comprising first conductive films on the interior of said cylindrical sleeve that do not contact the hemispherical structures, or comprising second conductive films on the exterior of said sleeve, with said first or second conductive films forming a capacitor between said rod and the interior or exterior metallic surface of said cylindrical sleeve, respectively.

* * * * *